(12) United States Patent
Wu et al.

(10) Patent No.: US 8,085,547 B2
(45) Date of Patent: Dec. 27, 2011

(54) ELECTRONIC ELEMENTS CARRIER

(75) Inventors: Ying-Cheng Wu, Taipei Hsien (TW); Kun-Hsiao Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 1046 days.

(21) Appl. No.: 11/948,526

(22) Filed: Nov. 30, 2007

(65) Prior Publication Data

US 2008/0266822 A1     Oct. 30, 2008

(30) Foreign Application Priority Data

Apr. 29, 2007   (CN) .......................... 2007 1 0200561

(51) Int. Cl.
 *H05K 1/18* (2006.01)

(52) U.S. Cl. ......... 361/762; 361/763; 361/764; 361/782

(58) Field of Classification Search .......... 361/763–766, 361/782–784, 790; 174/520–523; 257/787–790
See application file for complete search history.

(56) References Cited

U.S. PATENT DOCUMENTS

| | | | | |
|---|---|---|---|---|
| 4,640,010 A * | 2/1987 | Brown | | 29/832 |
| 5,241,456 A * | 8/1993 | Marcinkiewicz et al. | | 361/792 |
| 5,346,750 A | 9/1994 | Hatakeyama et al. | | |
| 6,153,928 A * | 11/2000 | Cho | | 257/686 |
| 6,214,525 B1 * | 4/2001 | Boyko et al. | | 430/313 |
| 7,262,497 B2 * | 8/2007 | Fang | | 257/701 |
| 7,808,798 B2 * | 10/2010 | Cotte et al. | | 361/763 |
| 2004/0226743 A1 | 11/2004 | Fang | | |
| 2007/0132536 A1 | 6/2007 | Lee et al. | | |

FOREIGN PATENT DOCUMENTS

| | | |
|---|---|---|
| CN | 1156949 A | 8/1997 |
| TW | 485516 | 5/2002 |
| TW | I222734 | 10/2004 |
| TW | I228802 | 3/2005 |
| TW | M278062 | 10/2005 |
| TW | I263313 | 10/2006 |

* cited by examiner

*Primary Examiner* — Tuan T Dinh
(74) *Attorney, Agent, or Firm* — Altis Law Group, Inc.

(57) ABSTRACT

An electronic elements carrier includes a body, at least an electronic element and a filler. The body includes a substrate having a plate and a dam formed on the peripheral of plate, a conductive layer mounted on a surface of the dam, and at least a cavity defined by the plate and the dam of the substrate. The electronic element is disposed in the cavity of the body. The filler is received in the cavity of the substrate for encapsulating, sealing and protecting the electronic element.

9 Claims, 7 Drawing Sheets

ELECTRONIC ELEMENTS CARRIER

TECHNICAL FIELD

The present invention relates to the art of electronic elements carrier and, particularly, to an electronic elements carrier integrated with some electronic elements and the manufacturing method thereof.

BACKGROUND

An electronic elements carrier serves as a support chassis for supporting various electronic components, such as integrated circuits, resistors, capacitors, and other components. The electronic elements carrier also provides the copper or other metallic conductors for conveying electrical current between the connected terminals of the electronic components.

Referring to FIG. 7, a typical related electronic elements carrier 10 such as a printed circuit board includes a number of electronic elements such as passive components 12. In the arrangement of the electronic elements carrier 10 above mentioned, the passive components 12 are embedded in the carrier 10, and electrically connected to other printed circuits or electronic elements positioned on the carrier 10 via inner circuits received in the carrier 10. However, the manufacturing process to produce the carrier 10 integrated with the passive components 12 is very complicated, thus inefficient, costly, and of limited use because it is impossible to make the passive components with large resistor value or capacitance or inductance embedded in the carrier 10.

Therefore, a low cost and more useful electronic elements carrier is desired.

SUMMARY

In a first presented embodiment, an electronic elements carrier includes a body, at least a electronic element, and a filler. The body includes a substrate having a plate and a dam formed on the peripheral of plate, a conductive layer mounted on a surface of the dam, and at least a cavity defined by the plate and the dam of the substrate. The conductive layer is attached on the surface of the dam of the substrate. The electronic element is disposed in the cavity of the body. The filler is received in the cavity of the substrate for encapsulating, sealing, and protecting the electronic element.

Those and other advantages and novel features will be more readily apparent from the following detailed description set forth below taken in conjunction with the accompanying drawings.

DETAILED DESCRIPTION OF THE EMBODIMENTS

Figure 1:
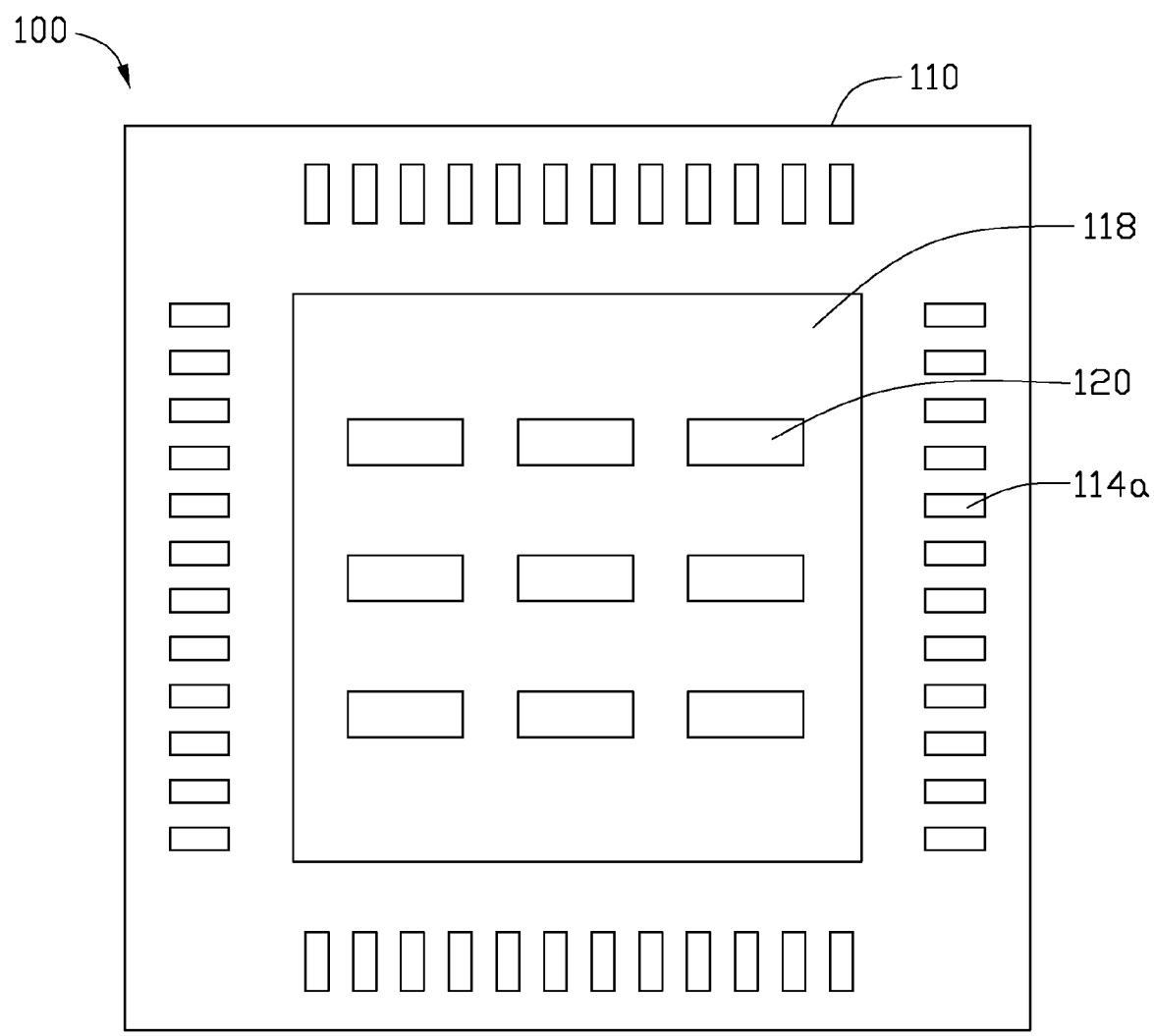
FIG. 1 is a schematic, top plan view of an electronic elements carrier, according to a first embodiment.
Figure 2:
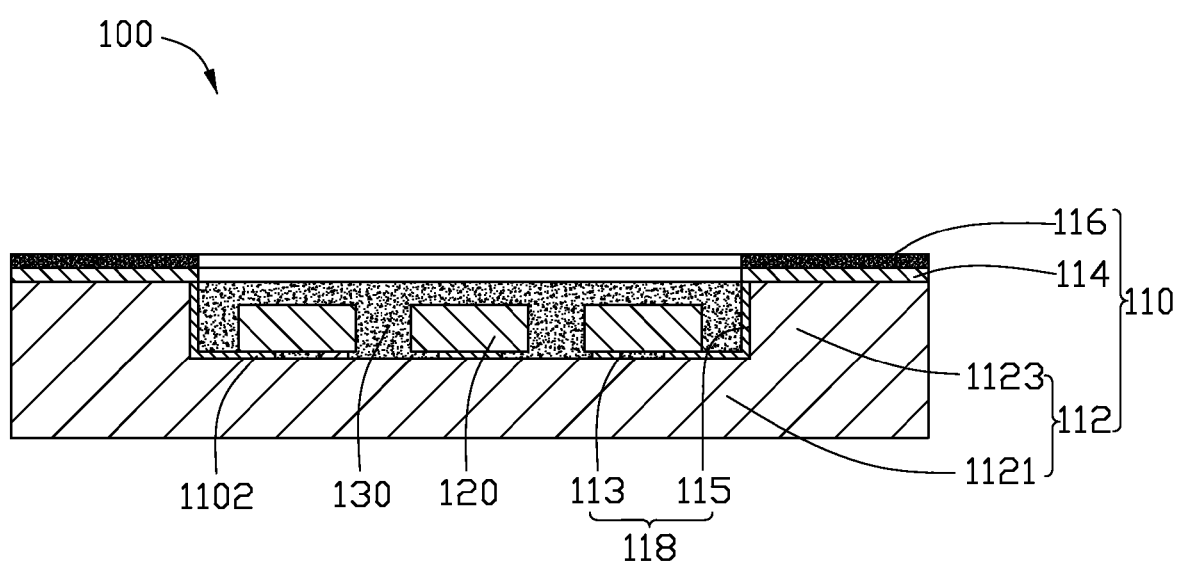
FIG. 2 is a schematic, cross-sectional view of FIG. 1

Referring to FIGS. 1-2, an electronic elements carrier 100, according to a first preferred embodiment, includes a body 110, at least a discrete element 120, and a filler 130.

The body 110 is a printed circuit board (PCB) made from material such as one or more of the following: phenolic resin copper-clad laminate, epoxy resin copper-clad laminate, polyester woven glass fabric copper-clad laminate, polyimide resin copper-clad laminate, polytetrafluoroethylene (PTFE) woven glass copper-clad laminate, ceramic substrate, nitrogen alumina substrate, silicon carbide substrate (SiC). The optimum selection of the body 110 is selected from a printed circuit board of a camera. The body 110 includes a substrate 112, a conductive layer 114 and a mask layer 116. The mask layer 116 is laid on the conductive layer 114, and the conductive layer 114 is mounted on a surface of the substrate 112. A number of bonding pads 114a is formed on the periphery of the conductive layer 114, which is exposed through the mask layer 116.

The substrate 112 includes a plate 1121 and a dam 1123 formed on the periphery of the plate 1121, the dam 1123 of the substrate 112 protrudes upward from a surface 113 of the plate 1121. The plate 1121 and the dam 1123 of the substrate 112 together define a cavity 118. The cavity 118 can be any desired shape such as rectangular or cylindrical. Preferablely, a conductive liner 1102 is disposed in the cavity 118 and attached on the surface 13 of the plate 1121 and on an inner-sidewall 115 of the dam 1123 for electrically connecting the electronic elements 120 received in the cavity 118 to the conductive layer 114. The conductive layer 114 is attached on the dam 1123 of the substrate 112, and the mask 116 covers the conductive 114.

The electronic elements 120 such as decoupling capacitors, resistors, or inductors, are mechanically and electrically connected to an exterior electronic elements or a circuit via a connector. Thus the electronic elements 120 are positioned as close as possible to exterior electronic elements or circuits for suppressing interference and reducing power consumption.

The filler 130 is received in the cavity 118 to encapsulate, seal, and protect the electronic elements 120. The filler 130 may be gelatin, resin, polymer or other insulative material. If the electronic elements 120 are positioned in the cavity 120 wrong, the electronic elements 120 can be conveniently re-positioned or replaced in the cavity 118 until the electronic elements 120 are securely and accurately mounted in the cavity 118. In addition, the depth of the cavity 118 of the body 110 can vary according to the size of the electronic elements 120 so that the different-sized electronic elements 120 can be integrated in the body 110 to be available for use.

A method for manufacturing the electronic elements carrier 100 includes following steps: providing a plate 1121, forming a dam 1123 on a surface 113 of the plate 1121, the basic 1121 and the dam 1123 forming a substrate 112, the substrate 112 has a cavity 118 defined by the plate 1121 and the dam 123, and the cavity 118 of the substrate 112 can be any desired arbitrary shape such as rectangular, circular, oval, diamond or other shapes on any predetermined place of the substrate 112; forming a conductive liner 1102 in the cavity 118 extending along the surface 113 of the plate 1121 and the inner-sidewall 115 of the dam 1123 to the upper surface of the dam 1123; providing a conductive layer 114 on the upper surface of the dam 1123 of the substrate 112 via impressing or bonding to connect to the conductive liner 1102 disposed in the cavity 118 of the substrate 112; forming a mask layer 116 on the conductive layer 114 to prevent short circuits between two adjacent circuits 1102 of the conductive layer 114. The mask layer 116 is applied on the whole surface of the conductive layer 114 except regions formed with the bonding pads 114a for preventing oxidation of the conductive layer 114. In addition, the mask layer 116 has no affinity for melting solder during welding process. Thus the body 110 of the electronic elements carrier 100 is obtained.

The elements carrier 100 can then be tested for short or open circuits. After testing, filler 130 is received into the cavity 118 to cover and protect the electronic elements 120. Alternatively, the filler 130 can be fully filled in the cavity 118 to form a coplanar surface with the substrate 112.

The manufacturing method for producing the electronic elements carrier 100 is simple and easy to carry out.

Figure 3:
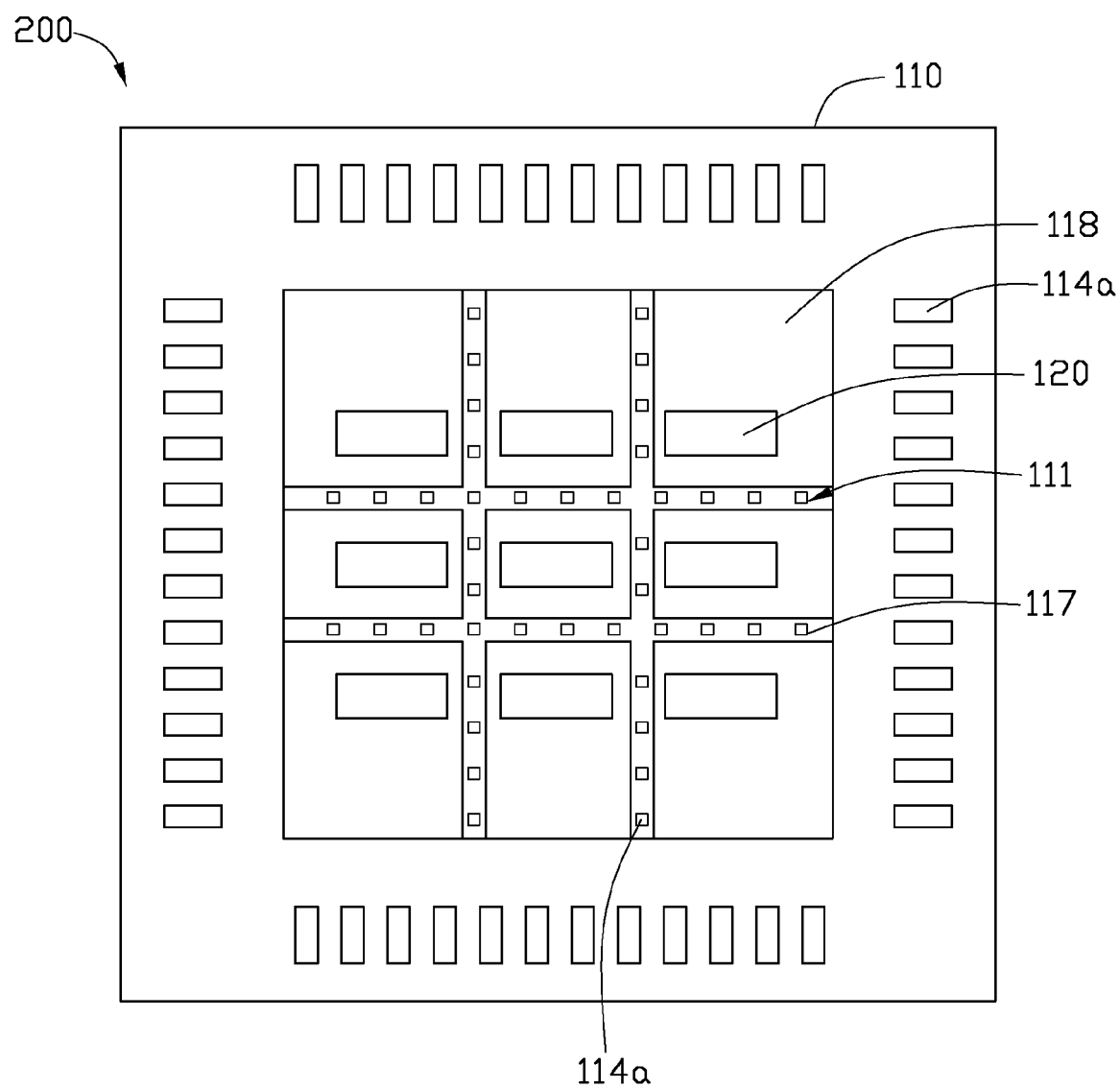
FIG. 3 is a schematic, top plan view of an electronic elements carrier, according to a second embodiment.
Figure 4:
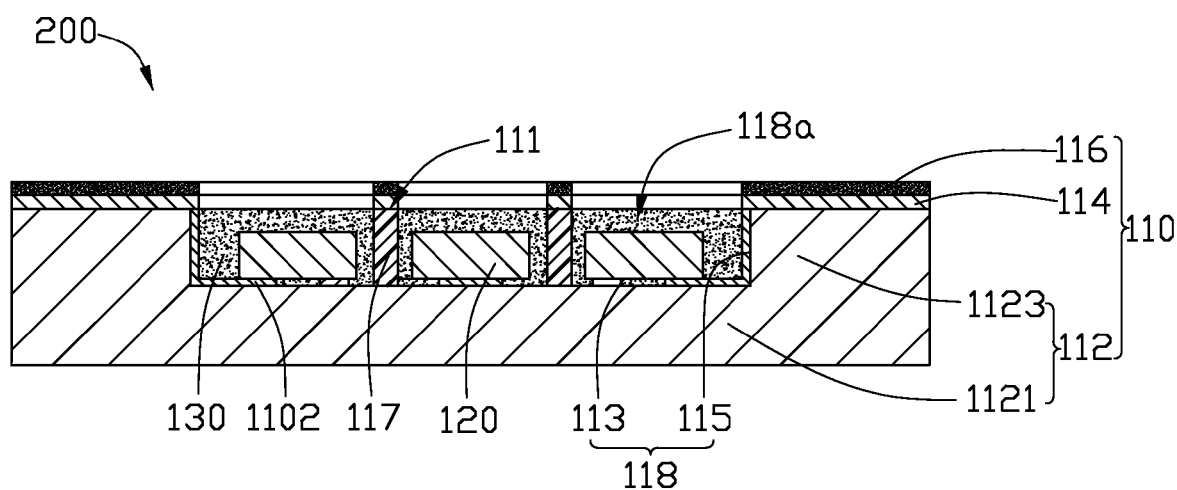
FIG. 4 is a schematic, cross-sectional view of FIG. 3.

Referring to FIGS. 3-4, an electronic elements carrier 200 according to a second preferred embodiment is provided. The electronic elements carrier 200 is similar to the electronic elements carrier 100 of the first preferred embodiment, the difference between them is stated as following:

A plurality of separators 117 are disposed in the cavity 118 of the substrate 112 to space the cavity 118 into a number of isolated chamber rooms 118a. The electronic elements 120 can be disposed in the chamber room 118a. A top surface 111 of the separator 117 is coplanar with a surface of the dam 1123. The conductive layer 114 is attached on both the top surface 111 of the separator 117 and the surface of dam 1123 of the substrate 112. Alternatively, the separator 117 is integrated with the dam 1123 or integrated with the substrate 112.

Conventionally, the bonding pads 114a of the electronic elements carrier 200 is arranged in ball grid array (BGA) formation for meeting the demand of quick installation via surface mounting technology (SMT). In this embodiment, the separator 117 is disposed in the cavity 118 of the substrate 112, and positioned between two adjacent electronic elements 120. Therefore, the conductive layer 114 can be attached on the top surface 111 of the separator 117 and the surface of the substrate 112 to form a ball grid array of bonding pads 114a.

A method of manufacturing the electronic elements carrier 200 includes following steps: providing a plate 1121, forming a dam 1123 on a surface 113 of the plate 1121, the basic 1121 and the dam 1123 forming a substrate 112, the substrate 112 has a cavity 118 defined by the plate 1121 and the dam 123, and the cavity 118 of the substrate 112 can be any desired arbitrary shape such as rectangular, circular, oval, diamond or other shapes on any predetermined place of the substrate 112; applying a conductive liner 1102 in the cavity 118, which extending along the surface 113 of the plate 1121 and the inner-sidewall 115 of the dam 1123 to the upper surface of the dam 1123; providing a separator 117 disposed in the cavity 118 of the substrate 112 to space the cavity 118 into a number of chamber rooms 118a; providing a conductive layer 114 applied to the upper surface of the dam 1123 and the top surface 111 of the separator 117 and connected to the conductive liner 1102 within the cavity 118; forming a mask layer 116 above the conductive layer 114 to prevent short circuits in two adjacent conductive liner 1102 of the conductive layer 114. Thereby the body 110 of the electronic elements carrier 200 is obtained.

At last, providing a number of electronic elements 120 which are respectively disposed in the chamber room 118a to connect to the conductive liner 1102 within the cavity 118; the electronic elements carrier 200 should be tested in a way same as the test method of electronic elements carrier 100.

After testing, some filler 130 is received into the cavity 118 to cover and protect the electronic elements 120.

Alternatively, in the process of manufacturing the electronic elements carrier 200, the separator 117 and the substrate 112 are integral as one body.

Figure 5:
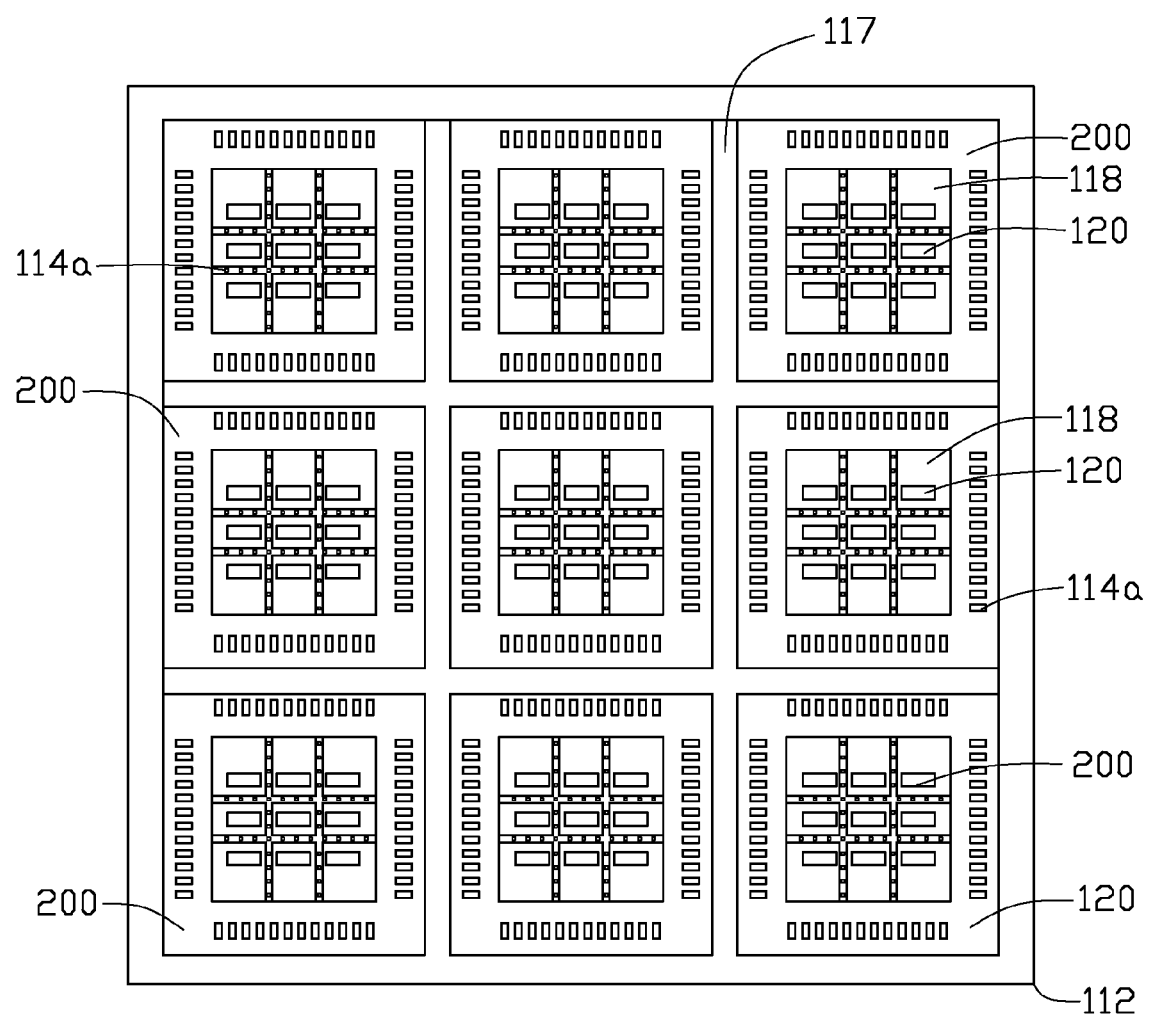
FIG. 5 is a schematic, top plan view of FIG. 3, formed on a monobloc body.

Referring to FIG. 5, a manufacture method of producing mass electronic elements carrier 200 for improving the production efficiency. Which includes following steps; providing a plate 1121, forming a number of uniformly spaced dams 1123 on a surface 113 of the plate 1121, the plate 1121 and the dams 1123 forming a substrate 112, the substrate 112 has a number of cavities 118 defined by the plate 1121 and the dam 123, and each cavity is spaced by a predetermined distances from the others; providing a number of electronic elements 120, those electronic elements 120 being disposed in the cavities 118 respectively, and each cavity 118 with the discrete element 120 being filled by the filler 130; providing a conductive layer 114 on the upper surface of the dam 112 via impressing or bonding way.

At least, dividing the substrate 112 for getting a number of single electronic elements carriers 200, thereby the production efficiency has been improved.

Figure 6:
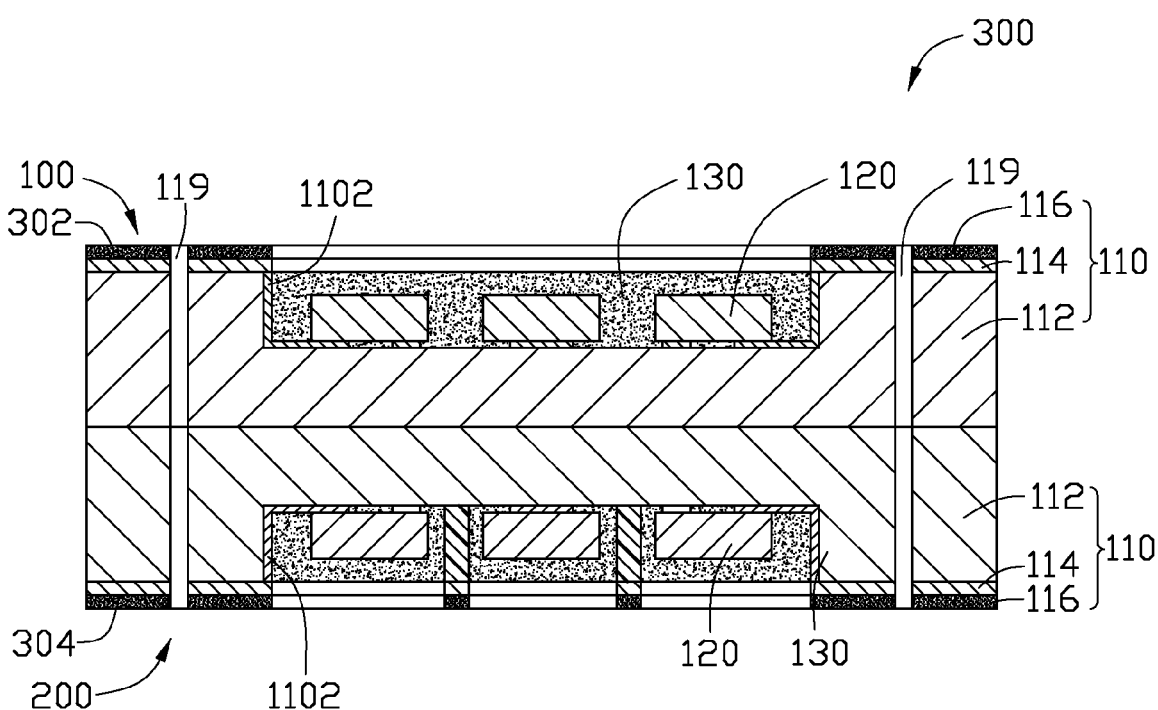
FIG. 6 is a schematic, cross-sectional view of an electronic elements carrier, according to a third embodiment of the present invention.
Figure 7:
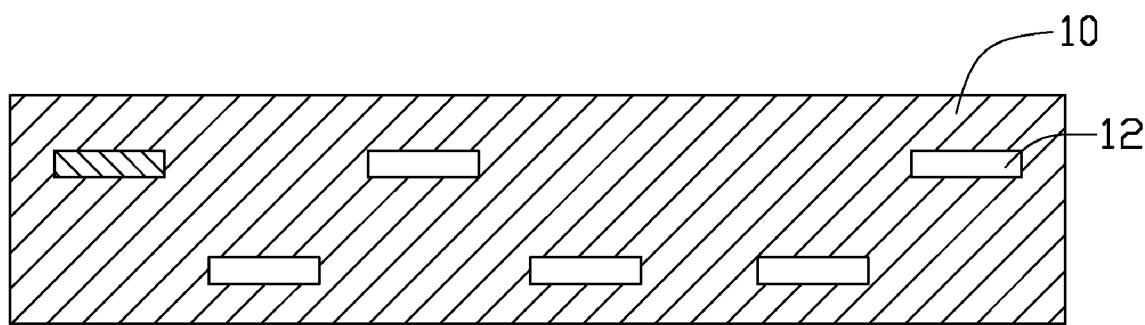
FIG. 7 is a schematic, cross-sectional view of a related electronic elements carrier.

Referring to FIG. 6, an electronic elements carrier 300, according to a third preferable embodiment of the present invention is provided. The electronic element carrier 300 is constructed by conjoining one carrier similar as the electronic elements carrier 200 and another carrier similar as the electronic elements 100 together, in which the cavities 118 respectively formed on the body 110 of the electronic elements carriers 100, 200 are exposed. Thereby a double-layer circuit board has accomplished. A number of through holes 119 is formed in the electronic elements carrier 300 to provide electrical connection between an upper surface 302 and a lower surface 304 of the electronic elements carrier 300. Understandably, the electronic elements carrier 300 may be constructed through two or more same carriers, and each of them is similar as the electronic elements carriers 100 or 200 via the method above mentioned.

In this embodiment, the electronic elements carrier 300 is configured by stacking two or more electronic elements carriers together to increase the surface utilization of the substrate 112 of the electronic elements carrier 300 and to improve the loading capacity. In addition, an electromagnetic shield can be placed between both bodies 110 of the electronic elements carrier 300.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An electronic elements carrier comprising:
   a body including a substrate having a plate and a dam formed on the periphery of the plate, a conductive layer mounted on an upper surface of the dam of the substrate, at least one cavity defined by the plate and the dam of the substrate;
   a plurality of electronic elements disposed in the cavity of the body; a conductive liner formed in the cavity of the substrate and extended along a surface of the plate and an inner-sidewall of the dam to the upper surface of the dam to electrically connect the conductive layer and the electronic elements received in the cavity;
   wherein the substrate further includes a separator formed in the cavity of the substrate to space the electronic elements received in the cavity of the substrate from each other, and a filler received in the cavity of the substrate for encapsulating, sealing and protecting the electronic elements.

2. The electronic elements carrier as claimed in claim 1, wherein the separator includes a top surface sharing a coplanar surface with the substrate, a part of the conductive layer is positioned on the top surface of the separator.

3. The electronic elements carrier as claimed in claim 1, wherein the separator and the substrate integrates as one body.

4. The electronic elements carrier as claimed in claim 1, wherein the electronic elements carrier further includes another body, and the two bodies have the same structure and are connected with each other.

5. The electronic elements carrier as claimed in claim 1, wherein the body is a printed circuit board, and the electronic elements are selected from decoupling capacitors, resistors, and inductors.

6. The electronic elements carrier as claimed in claim 1, wherein the filler is filled in the cavity to form a coplanar surface with the substrate.

7. The electronic elements carrier as claimed in claim 1, wherein the conductive layer attached on the top surface of the separator and the surface of the substrate form a ball grid array of bonding pads.

8. The electronic elements carrier as claimed in claim 4, wherein the conductive layer of one body and the conductive layer of another body are electrically connected with each other via a number of through holes formed in the substrate.

9. The electronic elements carrier as claimed in claim 8, wherein a mask layer is formed on the conductive layer, the conductive layer includes a number of bonding pads exposed through the mask layer.

* * * * *